US012781379B2

(12) United States Patent
Hudson et al.

(10) Patent No.: US 12,781,379 B2
(45) Date of Patent: Nov. 3, 2026

(54) METHODS FOR PREPARING A SINGLE CRYSTAL SILICON INGOT WITH REDUCED RADIAL RESISTIVITY VARIATION

(71) Applicant: GlobalWafers Co., Ltd., Hsinchu (TW)

(72) Inventors: Carissima Marie Hudson, St. Charles, MO (US); JaeWoo Ryu, Plano, TX (US); Young Gil Jeong, Frisco, TX (US); Chun-Sheng Wu, Hsinchu City (TW)

(73) Assignee: GlobalWafers Co., Ltd., Hsinchu (TW)

( * ) Notice: Subject to any disclaimer, the term of this patent is extended or adjusted under 35 U.S.C. 154(b) by 329 days.

(21) Appl. No.: 18/436,223

(22) Filed: Feb. 8, 2024

(65) Prior Publication Data

US 2024/0279840 A1 Aug. 22, 2024

Related U.S. Application Data

(60) Provisional application No. 63/486,126, filed on Feb. 21, 2023.

(51) Int. Cl.
*C30B 15/04* (2006.01)
*C30B 29/06* (2006.01)

(52) U.S. Cl.
CPC .............. *C30B 15/04* (2013.01); *C30B 29/06* (2013.01)

(58) Field of Classification Search
CPC .......... C30B 15/02; C30B 15/04; C30B 29/06
See application file for complete search history.

(56) References Cited

U.S. PATENT DOCUMENTS 9,786,748 B2 10/2017 Caspary et al.
10,337,117 B2 7/2019 Caspary et al.
10,378,122 B2 8/2019 Kang et al.
10,400,353 B2 9/2019 Hoshi et al.
11,242,616 B2 2/2022 Caspary et al.
2007/0193501 A1 8/2007 Ono et al.
2015/0349066 A1* 12/2015 Caspary .................. C30B 29/06 252/500
2017/0260645 A1 9/2017 Hoshi et al.
2018/0130722 A1* 5/2018 Wall .................... H10W 70/417
2018/0230622 A1 8/2018 Caspary et al.
2018/0237937 A1 8/2018 Kang et al.

FOREIGN PATENT DOCUMENTS

EP 2697412 A2 2/2014
EP 2737304 A1 6/2014
EP 2737305 A1 6/2014
JP 2016050140 A 4/2016
JP 2016060667 A 4/2016

(Continued)

*Primary Examiner* — Robert M Kunemund
(74) *Attorney, Agent, or Firm* — Armstrong Teasdale LLP

(57) ABSTRACT

Methods for preparing a single crystal silicon ingot with reduced radial resistivity variation are disclosed. The silicon melt is counter-doped in a plurality of batches while growing the single crystal silicon ingot. The amount of second dopant in each batch may be controlled to be less than a maximum amount that is determined based on a predetermined target minimum resistivity, a predetermined target maximum radial resistivity gradient, and a baseline radial resistivity gradient that occurs without counter-doping.

11 Claims, 8 Drawing Sheets

(56) References Cited

FOREIGN PATENT DOCUMENTS

| | | | | |
|---|---|---|---|---|
| JP | 2016216306 | A | * | 12/2016 |
| JP | 06073316 | B2 | | 2/2017 |
| JP | 06222013 | B2 | | 11/2017 |
| JP | 06299543 | B2 | | 3/2018 |
| JP | 06304125 | B2 | | 4/2018 |
| JP | 2022067701 | A | | 5/2022 |
| WO | 2016031164 | A1 | | 3/2016 |
| WO | 2017202656 | A1 | | 5/2016 |
| WO | 2017026648 | A1 | | 2/2017 |
| WO | 2023007830 | A1 | | 2/2023 |

* cited by examiner

METHODS FOR PREPARING A SINGLE CRYSTAL SILICON INGOT WITH REDUCED RADIAL RESISTIVITY VARIATION

CROSS-REFERENCE TO RELATED APPLICATIONS

This application claims the benefit of U.S. Provisional Patent Application No. 63/486,126, filed Feb. 21, 2023, which is incorporated herein by reference in its entirety.

TECHNICAL FIELD

The field of the disclosure relates to methods for preparing a single crystal silicon ingot with reduced radial resistivity variation and methods for determining the number of batches of counter-dopant to add to a silicon melt from which a single crystal silicon ingot is grown to increase the saleable number of wafers sliced from the single crystal silicon ingot.

BACKGROUND

Counter-doping is used in various solar and semiconductor applications to increase throughput and prime yield of the single crystal silicon ingot. For example, N-type IGBT applications may involve counter-doping with P-type dopants to achieve relatively tight resistivity tolerances (e.g., <+/−13% range or less). While counter-doping protocols may involve methods for meeting relatively tight resistivity tolerances, such methods do not address control of radial resistivity variation during the counter-doping transition.

The radial resistivity variation may depend on the interface shape (i.e., the boundary between the growing crystal and the melt) and selected growth conditions (e.g., melt flow conditions, hot zone configuration, magnet type, and the like). Addition of counter-dopants during crystal growth causes a transitory radial resistivity change (dependent on melt flow kinetics, interface, magnetic field type and strength, crucible rotation, seed rotation, and the like) over a time scale of several tens of minutes during which the radial resistivity gradient of the material can exceed customer specifications which results in such material being scrapped. The scrapped length depends on the transient time scale and pull speed and may exceed several tens of millimeters.

A need exists for methods for counter-doping that reduce or eliminate axial ingot portions which include out of specification radial resistivity gradients.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for preparing a single crystal silicon ingot with reduced radial resistivity variation during counter-doping. The single crystal silicon ingot has a predetermined target minimum resistivity (Rmin) and a predetermined target maximum radial resistivity gradient (RRGmax). An initial charge of solid-state silicon is added to a crucible. The crucible that includes the initial charge of solid-state silicon is heated to cause a silicon melt to form in the crucible. A first dopant is added to the crucible to produce a doped silicon melt. A silicon seed crystal is contacted with the doped silicon melt. The silicon seed crystal is withdrawn to grow a single crystal silicon ingot. The silicon melt is counter-doped by adding a second dopant to the silicon melt in a plurality of batches while growing the single crystal silicon ingot. The amount of second dopant in each batch does not exceed a maximum amount (Mmax). The maximum amount Mmax is determined by determining a baseline radial resistivity gradient (RRGbase) that occurs without counter-doping. The maximum resistivity (Rmax) at which the resistivity of the silicon melt may be increased during counter doping without exceeding RRGmax is determined by the following formula:

$$Rmax = ((RRGmax - RRGbase) * Rmin) + Rmin.$$

Mmax is the maximum amount of second dopant that can be added in a batch without increasing the resistivity of the melt above Rmax.

Yet another aspect of the present disclosure is directed to a method for determining the number of batches of counter-dopant to add to a silicon melt from which a single crystal silicon ingot is grown to increase the saleable number of wafers sliced from the single crystal silicon ingot. The batches of counter-dopant are added during growth of the single crystal silicon ingot. The silicon melt is doped with a first dopant different from the counter-dopant before ingot growth. A maximum amount (Mmax) of counter-dopant that can be added in each batch is determined by determining a baseline radial resistivity gradient (RRGbase) that occurs without counter-doping. The maximum resistivity (Rmax) at which the resistivity of the silicon melt may be increased during counter doping without exceeding RRGmax is determined by the following formula:

$$Rmax = ((RRGmax - RRGbase) * Rmin) + Rmin.$$

Rmin is a predetermined target minimum resistivity of the single crystal silicon ingot. RRGmax is a predetermined target maximum radial resistivity gradient of the single crystal silicon ingot. Mmax is the maximum amount of counter-dopant that can be added in a batch without increasing the resistivity of the melt above Rmax as determined from a model. The number of batches of counter-dopant is selected to maximize a length of the ingot that has a resistivity above Rmin without exceeding a predetermined total counter-dopant concentration (Cmax).

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
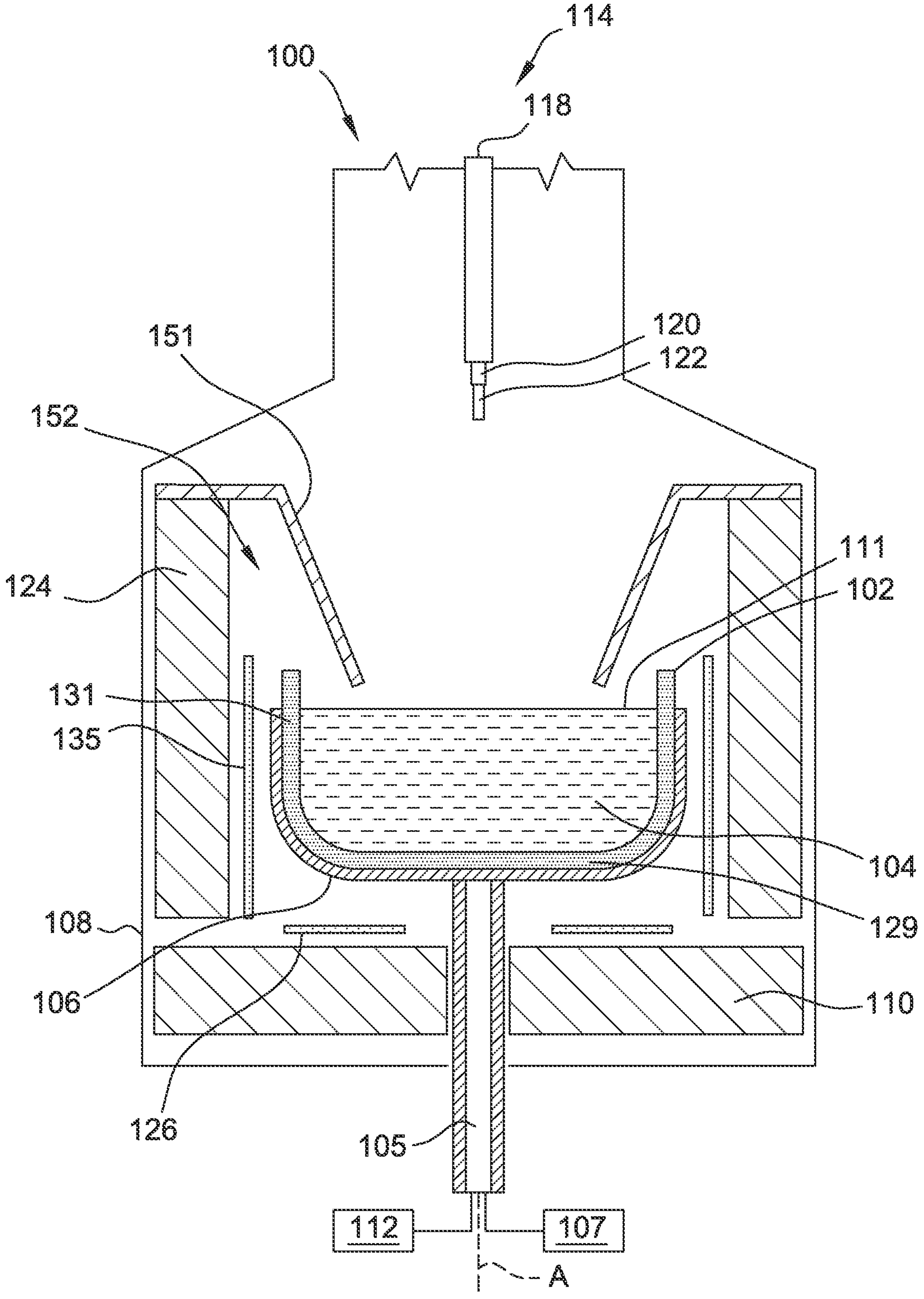
FIG. 1 is a cross-section of an ingot puller apparatus before silicon ingot growth.

Provisions of the present disclosure relate to methods for determining the number and/or size of batches of counter-dopant added to a silicon melt based on a targeted maximum of the radial resistivity gradient of wafers sliced from the single crystal silicon ingot. The methods of the present disclosure may generally be carried out in any ingot puller apparatus that is configured to pull a single crystal silicon ingot. An example ingot puller apparatus (or more simply "ingot puller") is indicated generally at "100" in FIG. 1. The ingot puller apparatus 100 includes a crucible 102 for holding a melt 104 of semiconductor or solar-grade material, such as silicon, supported by a susceptor 106. The ingot puller apparatus 100 includes a crystal puller housing 108 that defines a growth chamber 152 for pulling a silicon ingot 113 (FIG. 2) from the melt 104 along a pull axis A.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface).

In some embodiments, the crucible 102 is layered. For example, the crucible 102 may be made of a quartz base layer and a synthetic quartz liner disposed on the quartz base layer.

The susceptor 106 is supported by a shaft 105. The susceptor 106, crucible 102, shaft 105 and ingot 113 (FIG. 2) have a common longitudinal axis A or "pull axis" A.

A pulling mechanism 114 is provided within the ingot puller apparatus 100 for growing and pulling an ingot 113 from the melt 104. The pulling mechanism 114 includes a pulling cable 118, a seed holder or chuck 120 coupled to one end of the pulling cable 118, and a silicon seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 (FIG. 2) to be withdrawn from the melt 104.

Figure 2:
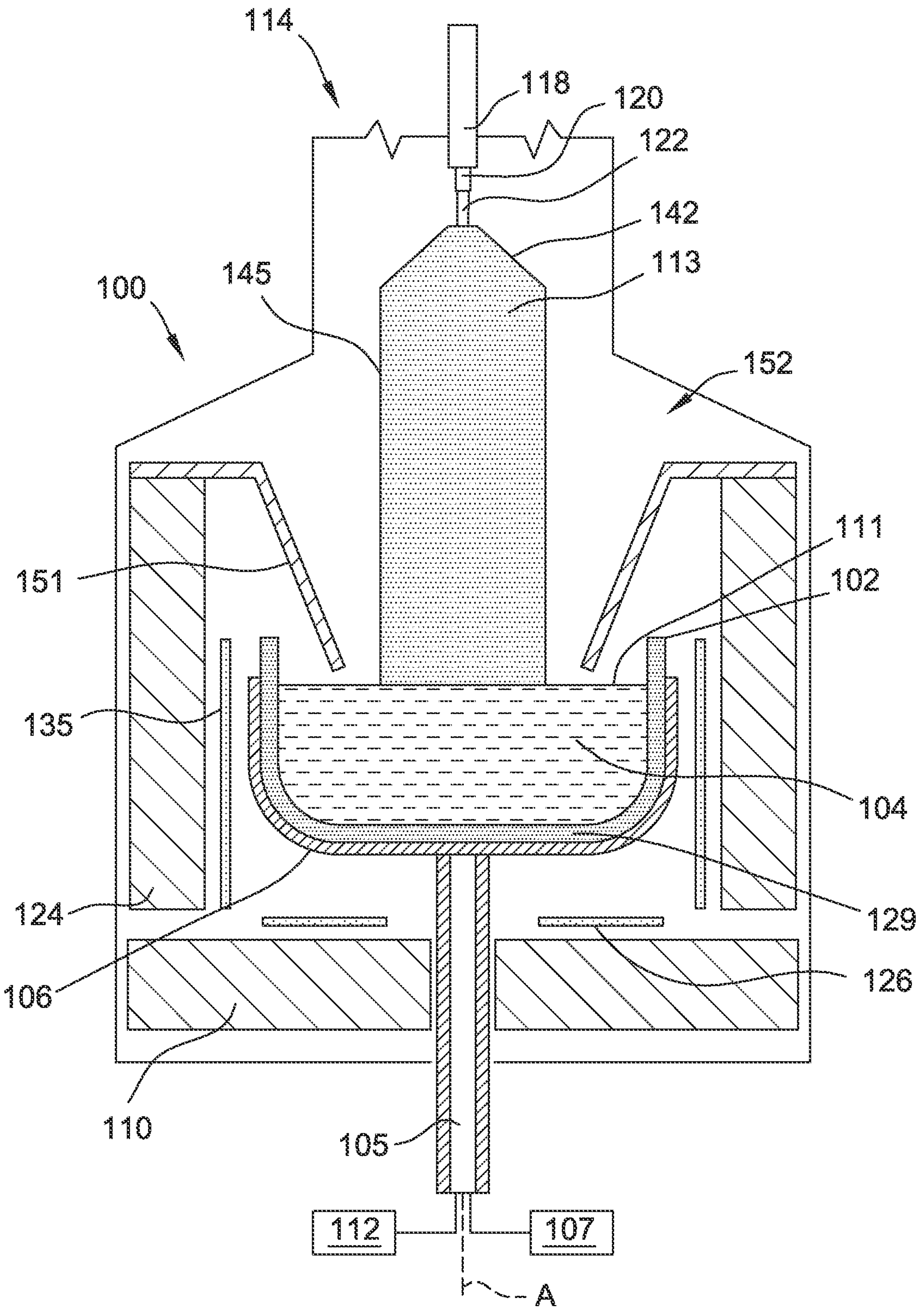
FIG. 2 is a cross-section of the ingot puller apparatus during silicon ingot growth.

During heating and crystal pulling, a crucible drive unit 107 (e.g., a motor) rotates the crucible 102 and susceptor 106. A lift mechanism 112 raises and lowers the crucible 102 along the pull axis A during the growth process. For example, the crucible 102 may be at a lowest position (near the bottom heater 126) in which an initial charge of solid-state polycrystalline silicon previously added to the crucible 102 is melted. Crystal growth commences by contacting the melt 104 with the seed crystal 122 and lifting the seed crystal 122 by the pulling mechanism 114. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100 (FIG. 2).

A crystal drive unit (not shown) may also rotate the pulling cable 118 and ingot 113 (FIG. 2) in a direction opposite the direction in which the crucible drive unit 107 rotates the crucible 102 (e.g., counter-rotation). In embodiments using iso-rotation, the crystal drive unit may rotate the pulling cable 118 in the same direction in which crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of solid-state silicon (e.g., polycrystalline silicon) is charged to the crucible 102. The initial semiconductor or solar-grade material that is introduced into the crucible is melted by heat provided from one or more heating elements to form a silicon melt in the crucible. The ingot puller apparatus 100 includes bottom insulation 110 and side insulation 124 to retain heat in the puller apparatus. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104. Referring now to FIG. 2, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible 102 during crystal growth (FIG. 2).

Figure 3:
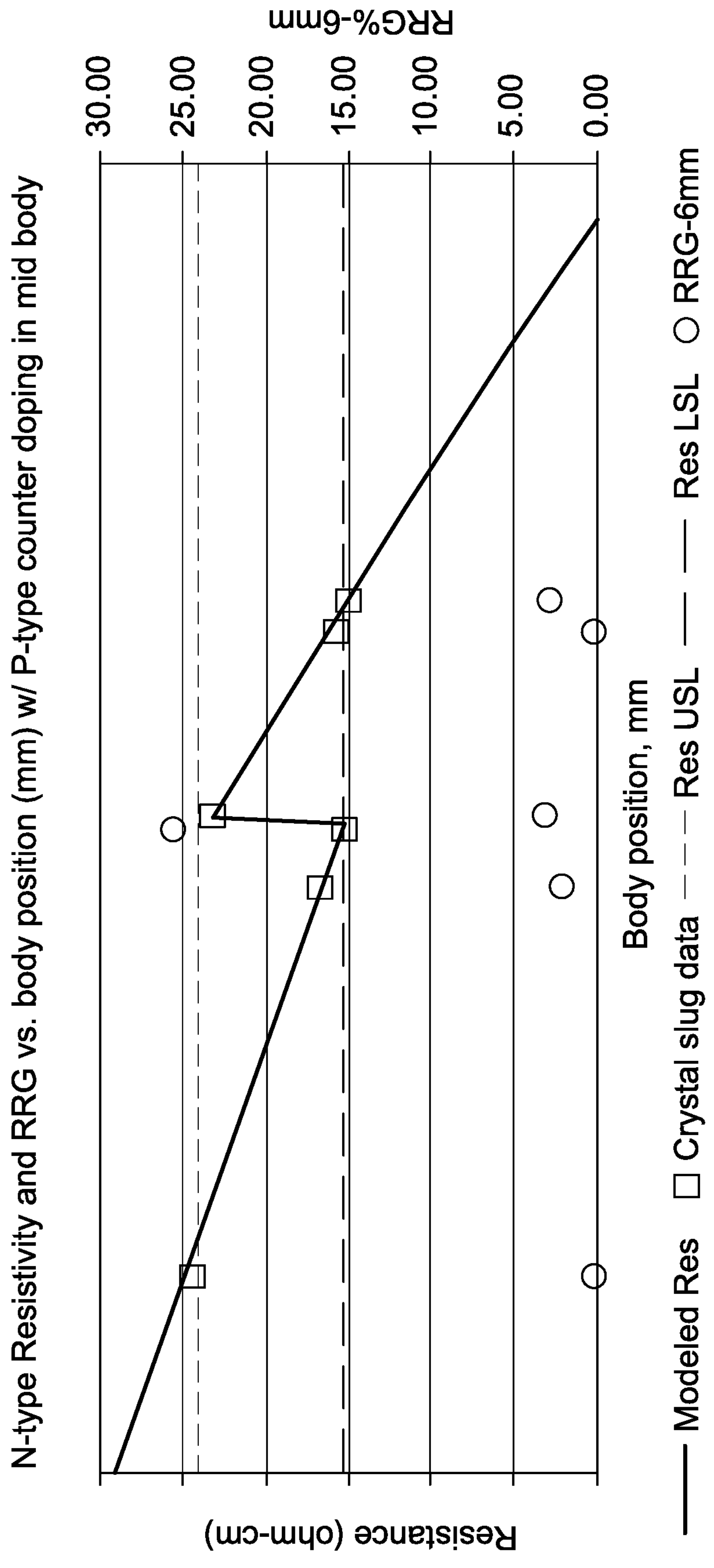
FIG. 3 is a graph showing changes in resistivity and the radial resistivity gradient upon counter-doping in a single batch.

In accordance with embodiments of the present disclosure, the silicon melt 104 may be doped with a first dopant (i.e., by adding first dopant to the solid-state silicon before or during meltdown or to the silicon melt after meltdown) and then counter-doped while withdrawing the single crystal silicon ingot from the melt. The single crystal silicon ingot may have a predetermined target minimum resistivity (Rmin) (shown as "Res LSL" in FIG. 3) such that the growth process is adapted (e.g., by counter-doping) to increase the amount of single crystal silicon ingot that is above Rmin (i.e., to increase the saleable portion of the ingot). As shown in FIG. 3, due to differences in the segregation coefficient between N-type species and P-type species, the resistivity of the melt may decrease during ingot growth. Counter-doping during ingot growth increases the resistivity and increases the prime (i.e., portion in which saleable wafers may be sliced) portion of the ingot. There may also be a predetermined maximum resistivity (shown as "Res USL" in FIG. 3) of the ingot with ingot portions above this maximum resistivity being non-prime.

The single crystal silicon may also have a predetermined target maximum radial resistivity gradient (RRGmax). In some embodiments, RRGmax is determined from the difference in resistivity at a central axis of the crystal silicon ingot and the resistivity at the edge (e.g., toward the edge such as 6 mm from the edge) divided by the resistivity at the center ((C−E)/C). In some embodiments, the predetermined (i.e., preselected before growth of the single crystal silicon ingot) minimum resistivity, maximum resistivity, and the maximum radial resistivity gradient are preselected customer specifications for single crystal silicon wafers that are sliced from the single crystal silicon ingot (i.e., selected before ingot growth with the ingot growth parameters being adapted to not exceed the specification limits). For example, Rmin may be selected to be 10 ohm-cm or more, 20 ohm-cm or more, 30 ohm-cm or more, 50 ohm-cm or more, 100 ohm-cm or more, or 200 ohm-cm or more (from 10 ohm-cm to 1000 ohm cm, 10 ohm-cm to 500 ohm-cm or 10 ohm-cm to 250 ohm-cm). Alternatively or in addition, RRGmax may be 10% or less, 6% or less or 5% or less.

After the doped melt is prepared and stabilizes, ingot growth commences by contacting the silicon seed crystal 122 with the doped silicon melt 104 and withdrawing the silicon seed crystal 122 to grow the single crystal silicon ingot 113 (FIG. 2). As the ingot 113 is withdrawn from the melt 104, the melt 104 is counter-doped with a second dopant (which may also be referred to herein as a "counter-dopant") in a plurality of batches (e.g., not continuously and in discreet amounts with periods of time between batches in which second dopant is not added).

The first dopant that is used to initially dope the ingot is a dopant of a first type (i.e., P-type or N-type) and the second dopant that is added to the melt during ingot growth is of a second type that is opposite the first type (i.e., if the first dopant is P-type then the second dopant is N-type and, if the first dopant is N-type, the second dopant is P-type). For example, the first dopant may be N-type such as phosphorous and the second dopant may be P-type such as boron. The second dopant may be introduced into the ingot puller apparatus 100 as a solid (added directly to the melt or added as a solid to the growth chamber 152 with the heat of the ingot puller causing sublimation and release of dopant gas) or may be introduced as a gas. In some embodiments, the second dopant is added in batches as a solid (e.g., boron-doped silicon chip). The second dopant is added between the crucible sidewall 131 and the growing crystal. The second dopant migrates toward the melt center which causes a second dopant gradient between the crystal center axis and the outer circumference of the crystal to form. The path of the dopant in the melt depends on the melt flow and diffusion which are dependent on the hotzone and the magnet. The dopant path dictates the dopant incorporation, either starting at the edge or the center.

In accordance with embodiments of the present disclosure, the amount of dopant in each batch of second dopant that is added does not exceed a maximum amount (Mmax). As discussed further below, the maximum amount is an amount that does not cause the radial resistivity gradient to exceed the predetermined maximum (RRGmax).

In some embodiments of the present disclosure, Mmax is determined by first determining the maximum resistivity (Rmax) at which the resistivity of the melt (i.e., the solidifying portion of the ingot) may be increased upon addition of a batch without exceeding RRGmax. For example, Rmax may be determined by the following formula:

$$R\text{max} = ((RRG\text{max} - RRGbase) * R\text{min}) + R\text{min}, \tag{1}$$

wherein Rmin is the predetermined target minimum resistivity (Rmin) and RRGbase is a baseline radial resistivity gradient (RRGbase) that occurs without counter-doping (i.e., the radial gradient in resistivity that would occur during ingot growth with doping by first dopant but without addition of batches of second dopant).

Once Rmax is known, Mmax can be determined. Mmax is the maximum amount of second dopant that can be added in a batch without increasing the resistivity of the melt above Rmax. The maximum amount (Mmax) of second dopant that can be added in a batch without increasing the resistivity of the melt above Rmax may be determined from a model such as a model that correlates dopant amounts to ingot resistivity.

Once the maximum amount (Mmax) of second dopant that can be added in a batch without increasing the resistivity of the melt above Rmax is known, the number of additions of second dopant (or "batches" in which second dopant is added) may be selected. The number of batches may be selected to maximize a length of the ingot that has a resistivity above Rmin. In some embodiments, the number of batches is maintained below a number at which a predetermined total second dopant concentration (Cmax) would be exceeded (e.g., below an amount that would cause the wafers sliced from the ingot to exceed a total second dopant concentration upper limit such as a limit set by a customer). The number of batches of second dopant that is selected to maximize a length of the ingot that has a resistivity above Rmin without exceeding a predetermined total second dopant concentration (Cmax) may be determined from a model. In some embodiments, Cmax is less than $1\times10^{15}$ atoms/$cm^3$, less than $1\times10^{14}$ atoms/$cm^3$, or less than $1\times10^{13}$ atoms/$cm^3$.

Compared to conventional methods, the methods of the present disclosure have several advantages. In conventional methods, the portion of the ingot grown immediately following counter-doping is scrapped because the radial resistivity gradient exceeds a predetermined upper limit. This transition time is further exasperated under conditions for low oxygen control because melt flow velocity is slower than general Czochralski growth conditions extending the transition time for radial resistivity change. Use of a formula to determine Rmax (e.g., (RRGmax−RRGbase)*Rmin)+Rmin) allows the counter doping addition amounts that fall within radial resistivity gradient limits (and above predetermined minimum resistivity) to be determined independent of the resistivity target. Counter-doping schemes that include intermittent counter-doping increase prime yield with reduced radial resistivity gradient.

EXAMPLES

The processes of the present disclosure are further illustrated by the following Examples. These Examples should not be viewed in a limiting sense.

Example 1: Effect of Boron Counter-Doping in a Single Batch

FIG. 3 illustrates the case in which a N-type single crystal silicon ingot is counter-doped by boron during ingot growth in a single batch. Y1 is resistivity (ohm-cm), Y2 is radial resistivity gradient (RRG %) between the ingot center axis and 6 mm from the edge, and X is the body position. The predetermined maximum resistivity ("Res USL") and predetermined minimum resistivity ("Res LSL") are also indicted. Center slug resistivity measurements (open squares) are shown on the Y1 axis and RRG % (open circles) are shown one the Y2 axis. RRG % was measured at 6 mm from the edge.

Single batch doping with boron increased resistivity from the lower specification limit to the upper specification limit, shifting the RRG % from a nominal baseline capability to well above 10%, causing the material to be scrapped (e.g., 20 to 40 mm of body length). Counter doping to the upper specification limit may be performed again when the resistivity decays to the lower specification limit and repeated to the end of body growth, each time causing a portion of the ingot to be scrapped as a prime loss.

Figure 4:
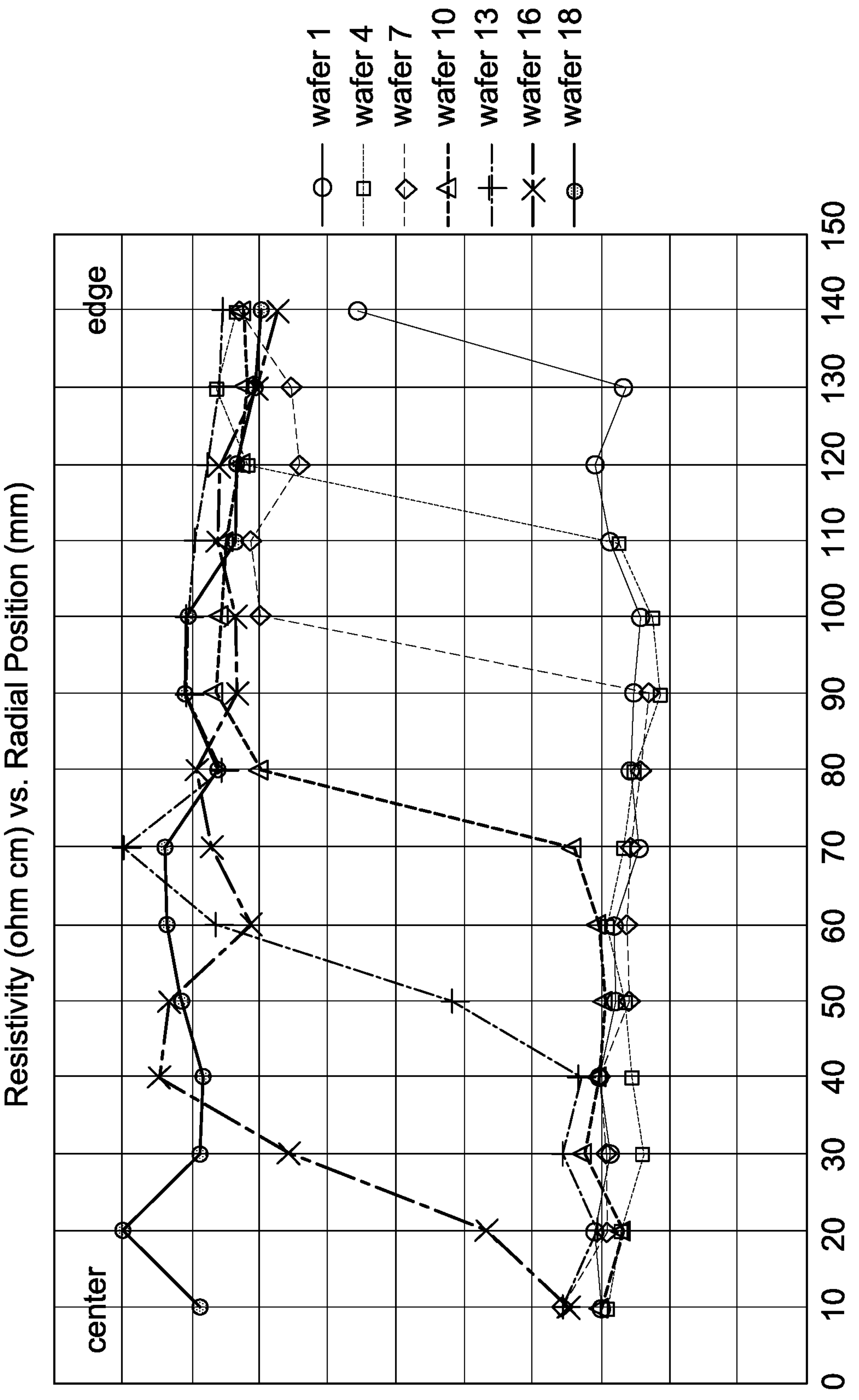
FIG. 4 is a graph of radial resistivity verse edge exclusion after counter-doping in a single batch.

Example 2: Transient Effect of Solid-Phase Boron Counter-Doping in a Single Batch An ingot was prepared according to the method of Example 1 (direct solid phase addition of boron in a single batch). The radial resistivity profiles for positions between the center (0 mm) and edge (140 mm) are shown in FIG. 4. Wafer 1 is nearly immediately following the dopant addition and wafer 18 is after several tens of minutes of axial crystal growth. In this case, boron counter dopant was added when the resistivity was near the lower limit and doped with enough boron to meet the upper limit. As shown in FIG. 4, the resistivity immediately spiked at the radial edge and slowly transitioned radially to the center. The radial resistivity gradient (RRG %) exceeded 10% in all wafers except wafer 18, when the resistivity has stabilized radially to nominal capability.

Figure 5:
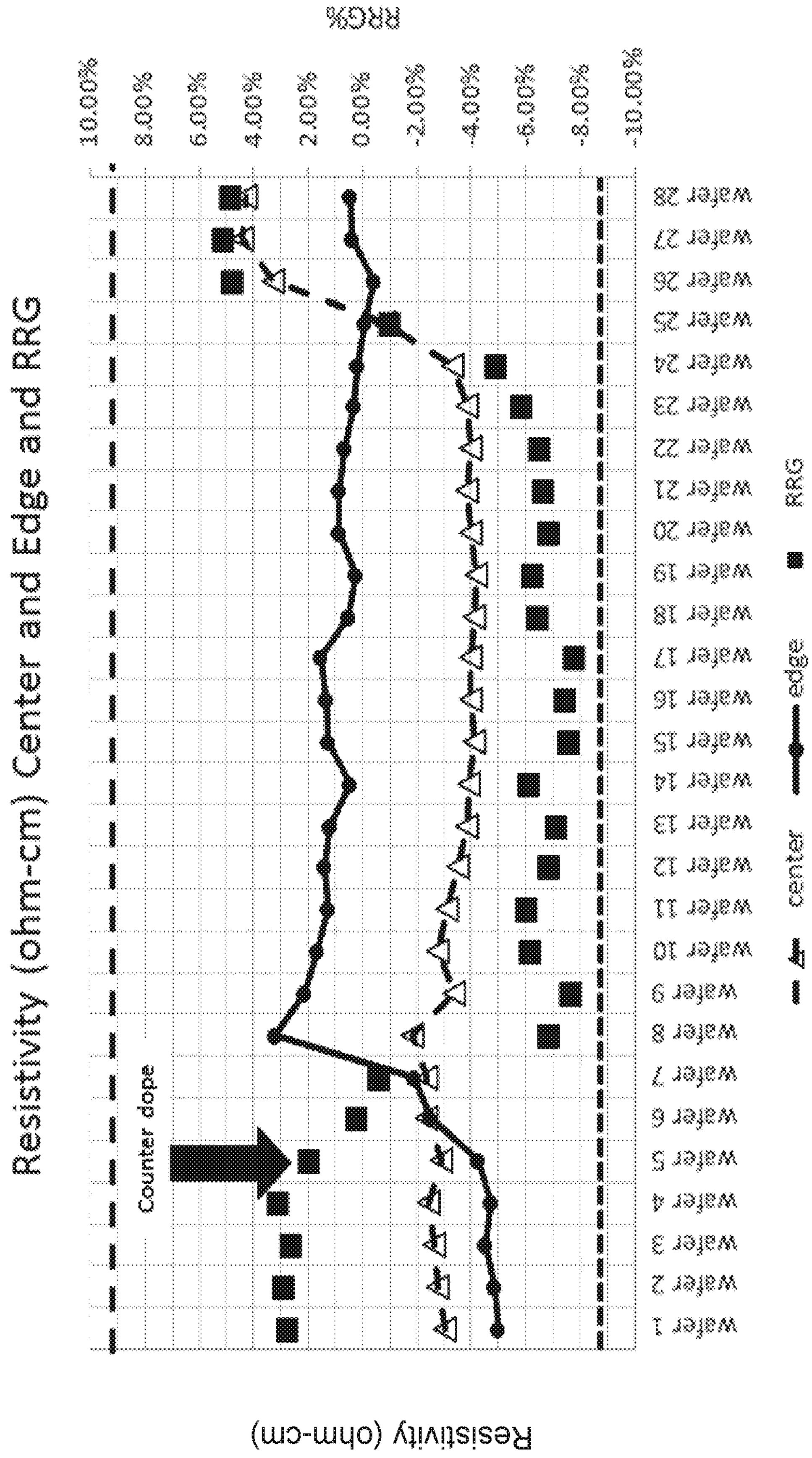
FIG. 5 is a graph of resistivity and radial resistivity gradient for wafers sliced from an ingot that was counter-doped in a single batch.

A second ingot was prepared with the same method and the center and edge (140 mm) resistivity of consecutive wafers are plotted on the Y1 axis in FIG. 5. The upper resistivity limit (USL) and lower resistivity limit (LSL) are also shown. The radial resistivity gradient ((center-edge)/center) was plotted in the Y2 axis. Boron was added by direct solid addition at wafer 5. The edge of the wafer raises to the counter doped level and it takes about 20 wafers for the center resistivity transition to complete. The RRG % immediately flips from positive where center resistivity is higher than the edge, to negative, where edge resistivity is higher than the center, and remains negative RRG until the transition completes. Even though the resistivity shift was about 50% of the specification limits as defined by the USL/LSL lines, the absolute value of the RRG % shifted outside of the nominal performance of the process.

Figure 6:
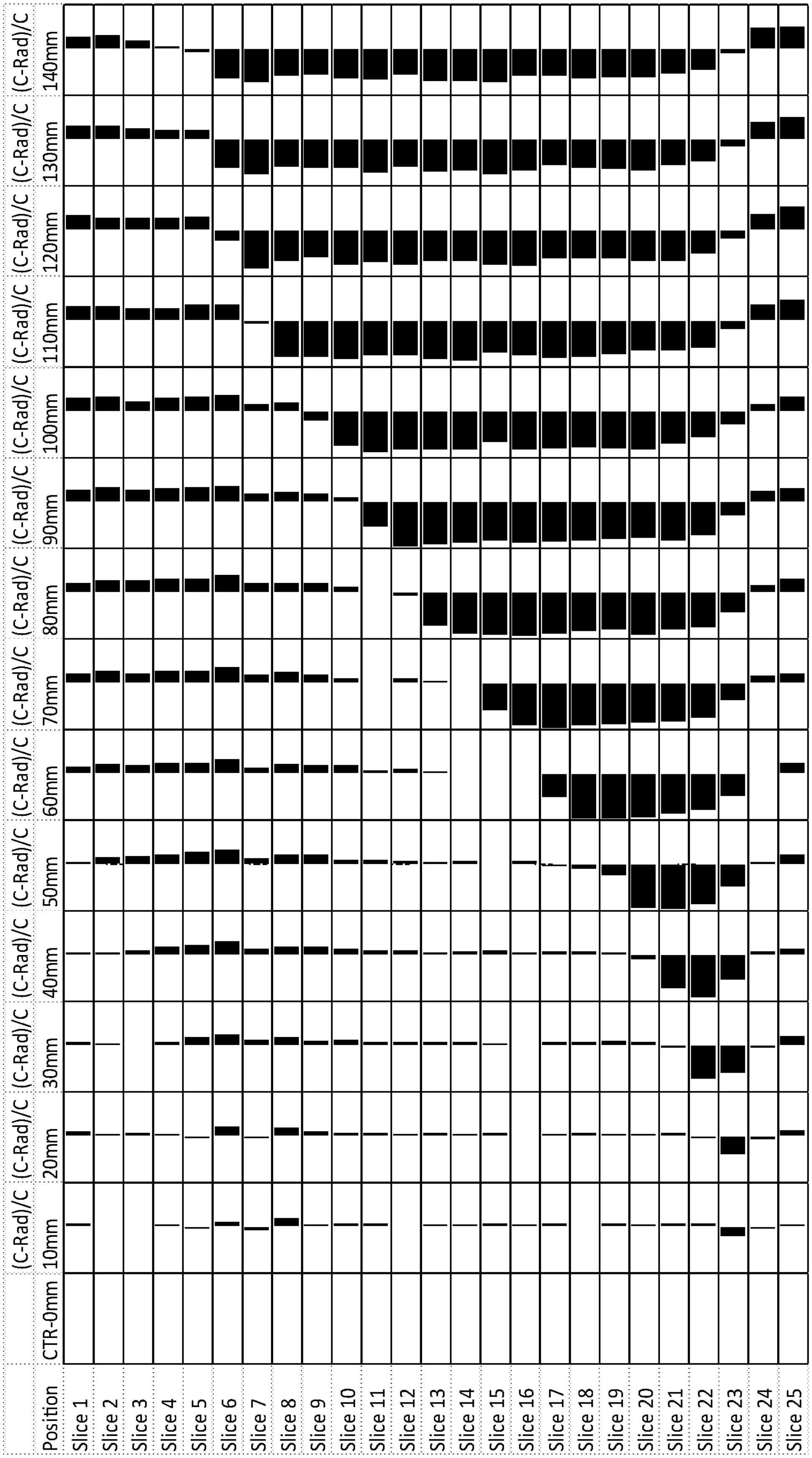
FIG. 6 is a graph of the wafer radial resistivity variation at different radial positions for wafers sliced from an ingot that was counter-doped in a single batch.

A pictorial view of the radial variation through the counter-doping transition is shown in FIG. 6 for the same ingot for wafers 1-25. The radial resistivity gradient was calculated every 10 mm ((center−radial position)/center). The maximum bar represents +/−10% RRG.

Example 3: Effect of Solid-Phase Boron Counter-Doping in Multiple Batches

Figure 7:
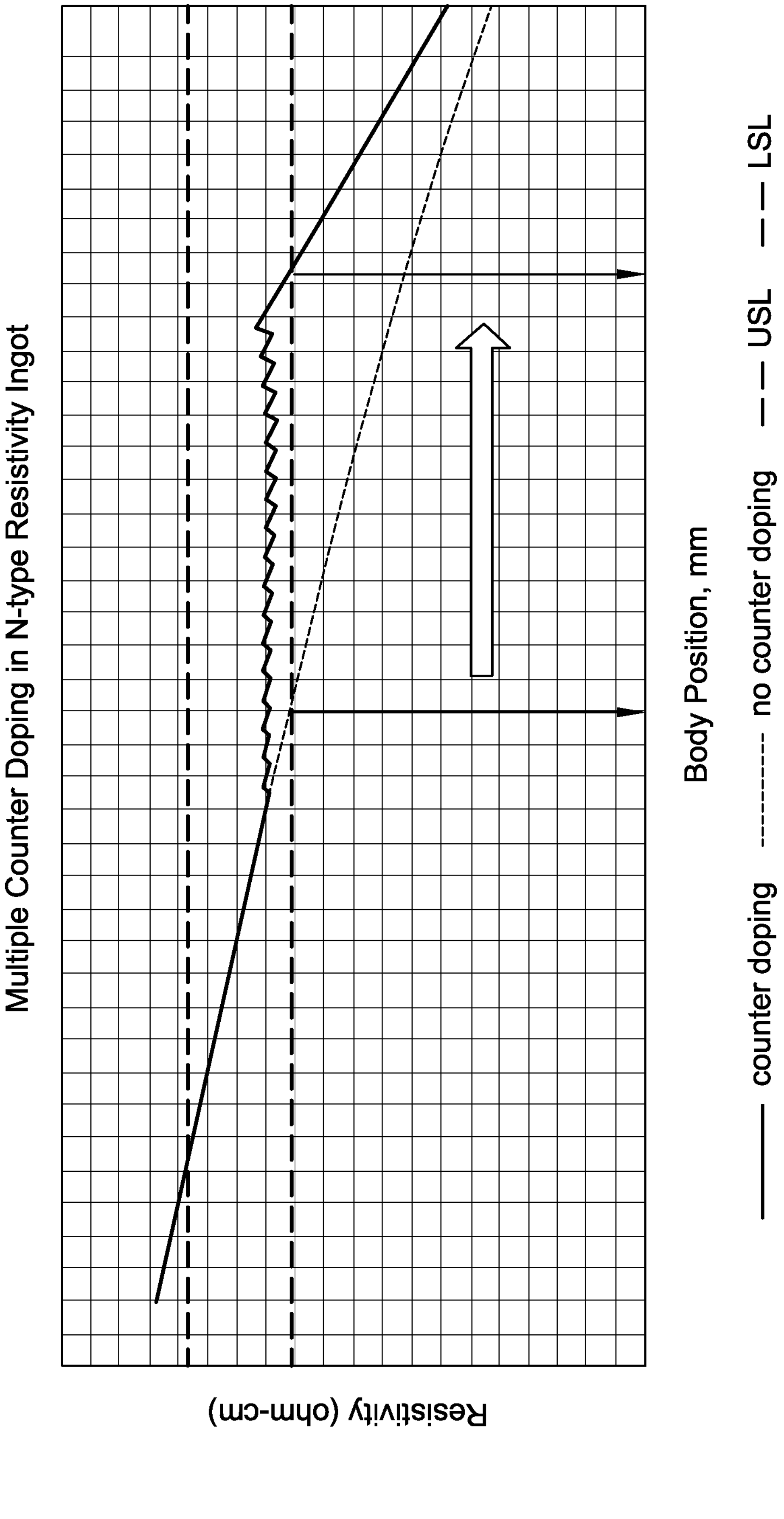
FIG. 7 is a graph of resistivity for an ingot which is counter-doped in multiple batches.

An ingot was growth by the process described in Example 2 but with a different counter-doping protocol. It has been found that prime losses can be reduced or eliminated entirely with intermittent direct solid phase doping if the doping concentration is adjusted so that the change in resistivity (measured by center and edge resistivity through the transition) is less than 10% RRG and or even within normal RRG % variation of the process. FIG. 7 shows a small amount of solid phase boron dopant being added multiple times (16 as shown) during crystal growth.

The resistivity shift increased by counter-doping was kept relatively small to maintain nominal RRG % expected in non-counter-doped products. The amount of boron counter doping addition was set to ensure overall RRG % was less than 6% and the counter doping amounts were determined by the methods of the present disclosure.

FIG. 7 also shows the advantage of multiple counter doping (solid line) over non-counter doping (small dashed line). The prime length can be extended (arrows) nearly twice with counter doping while maintaining a RRG % within normal capability range.

Figure 8:
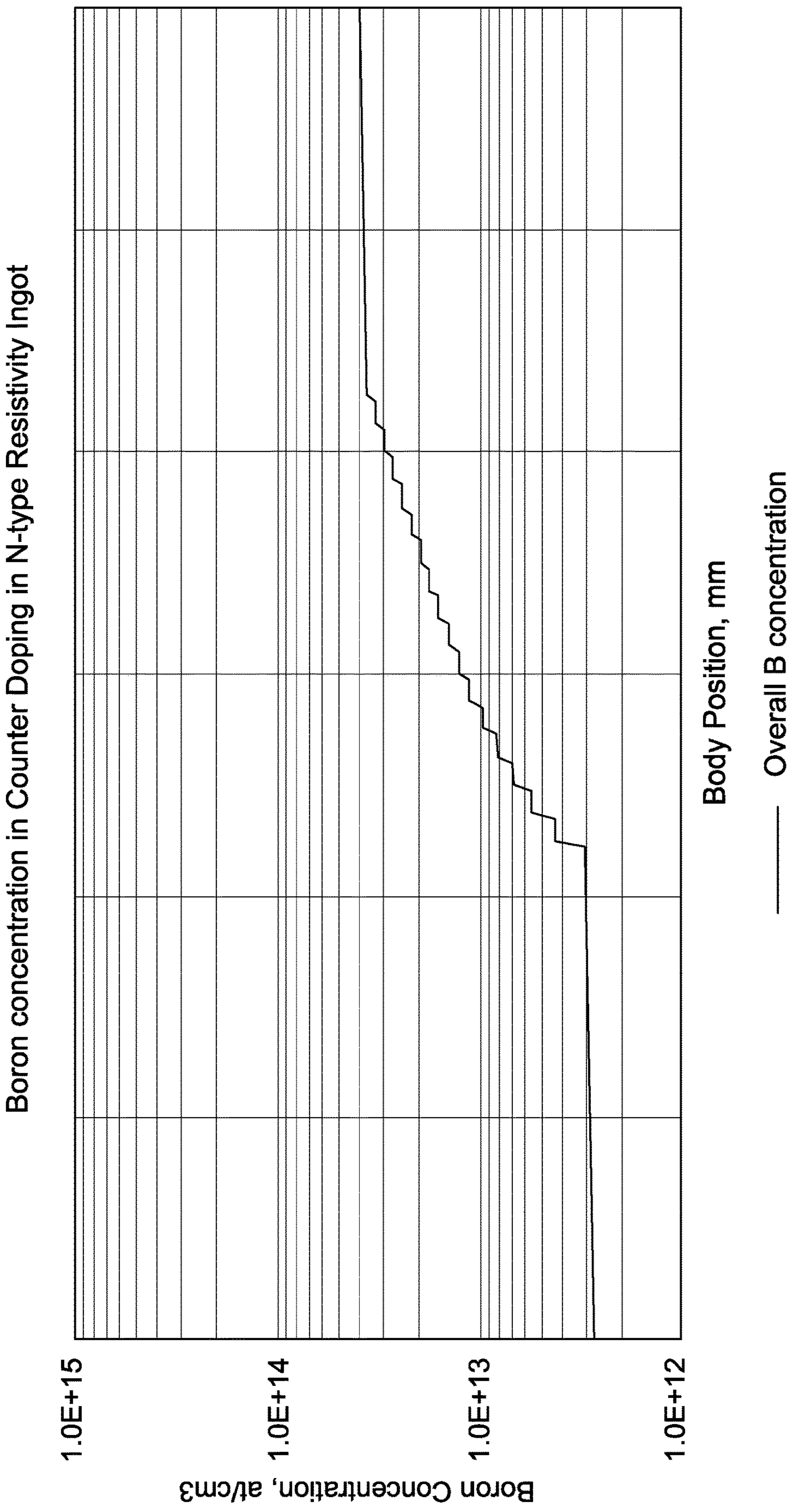
FIG. 8 is a graph of the modeled boron concentration along the body length of an ingot which was counter-doped in multiple batches.

Because it is desirable to minimize the counter doping element to ensure proper depletion layer thickness which impacts threshold voltage, an overall upper limit to the boron concentration allowed in any given wafer sliced from the ingot may be imposed (e.g., less than $1\times10^{15}$ atoms/$cm^3$, less than $1\times10^{14}$ atoms/$cm^3$, or less than $1\times10^{13}$ atoms/$cm^3$ depending on the customer requirement). To increase the sealable portion of the ingot, it is advantageous to delay the start of the boron counter doping scheme until the crystal resistivity is close to the lower resistivity limit. The boron concentration in the crystal as modeled is shown in FIG. 8. The overall boron concentration (atoms/$cm^3$) as a function of body position is shown. As shown in FIG. 8, counter-doping protocol was designed to ensure the boron concentration remained low.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for preparing a single crystal silicon ingot with reduced radial resistivity variation during counter-doping, the single crystal silicon ingot having a predetermined target minimum resistivity (Rmin) and a predetermined target maximum radial resistivity gradient (RRGmax), the method comprising:

adding an initial charge of solid-state silicon to a crucible;

heating the crucible comprising the initial charge of solid-state silicon to cause a silicon melt to form in the crucible;

adding a first dopant to the crucible to produce a doped silicon melt;

contacting a silicon seed crystal with the doped silicon melt;

withdrawing the silicon seed crystal to grow a single crystal silicon ingot; and counter-doping the silicon melt by adding a second dopant to the silicon melt in a plurality of batches while growing the single crystal silicon ingot, the amount of second dopant in each batch not exceeding a maximum amount (Mmax), Mmax being determined by:

determining a baseline radial resistivity gradient (RRGbase) that occurs without counter-doping; and determining the maximum resistivity (Rmax) at which the resistivity of the silicon melt may be increased during counter doping without exceeding RRGmax by the following formula:

$$Rmax = ((RRGmax - RRGbase) * Rmin) + Rmin;$$

wherein Mmax is the maximum amount of second dopant that can be added in a batch without increasing the resistivity of the melt above Rmax.

2. The method as set forth in claim 1 wherein the maximum amount of second dopant that can be added in a batch without increasing the resistivity of the melt above Rmax is determined from a model.

3. The method as set forth in claim 1 wherein the number of batches of the plurality of batches of second dopant is selected to maximize a length of the ingot that has a resistivity above Rmin without exceeding a predetermined total second dopant concentration (Cmax).

4. The method as set forth in claim 3 wherein Cmax is less than $1\times10^{15}$ atoms/cm$^3$.

5. The method as set forth in claim 3 wherein the number of batches of the plurality of batches of second dopant that is selected to maximize a length of the ingot that has a resistivity above Rmin without exceeding a predetermined total second dopant concentration (Cmax) is determined from a model.

6. The method as set forth in claim 1 wherein the first dopant is N-type and the second dopant is P-type.

7. The method as set forth in claim 6 wherein the first dopant is phosphorous and the second dopant is boron.

8. The method as set forth in claim 1 wherein RRGmax and RRGbase are each based on the difference in resistivity at a central axis of the crystal silicon ingot and the edge of the ingot, the difference being divided by the resistivity at the central axis.

9. The method as set forth in claim 1 wherein Rmin and RRGmax are customer specifications.

10. The method as set forth in claim 1 wherein RRGmax is 10% or less.

11. The method as set forth in claim 1 wherein Rmin is 100 ohm-cm or more.

* * * * *